United States Patent
Tegen et al.

(10) Patent No.: US 10,290,735 B2
(45) Date of Patent: May 14, 2019

(54) METHODS OF MANUFACTURING A SEMICONDUCTOR DEVICE WITH A BURIED DOPED REGION AND A CONTACT STRUCTURE

(71) Applicant: Infineon Technologies Dresden GmbH, Dresden (DE)

(72) Inventors: Stefan Tegen, Dresden (DE); Marko Lemke, Dresden (DE); Rolf Weis, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 15/855,563

(22) Filed: Dec. 27, 2017

(65) Prior Publication Data

US 2018/0122935 A1    May 3, 2018

Related U.S. Application Data

(62) Division of application No. 14/952,323, filed on Nov. 25, 2015, now Pat. No. 9,876,105.

(30) Foreign Application Priority Data

Nov. 28, 2014    (DE) .................. 10 2014 117 556

(51) Int. Cl.
    *H01L 29/45*    (2006.01)
    *H01L 29/739*   (2006.01)
    (Continued)

(52) U.S. Cl.
    CPC .. *H01L 29/7813* (2013.01); *H01L 21/823487* (2013.01); *H01L 27/0883* (2013.01);
    (Continued)

(58) Field of Classification Search
    None
    See application file for complete search history.

(56) References Cited

U.S. PATENT DOCUMENTS 8,928,050 B2    1/2015    Loechelt et al.
8,999,782 B2    4/2015    Loechelt et al.
(Continued)

OTHER PUBLICATIONS

El-Kareh, Badih, "Fundamentals of Semiconductor Processing Technologies", IBM Corporation, Kluwer Academic Publishers, 1995, pp. 538-539, 562.

*Primary Examiner* — Telly D Green
(74) *Attorney, Agent, or Firm* — Murphy, Bilak & Homiller, PLLC

(57) ABSTRACT

A method of manufacturing a semiconductor device includes: forming a doped region in a semiconductor substrate at a first distance to a main surface plane of the semiconductor substrate, wherein the doped region is a first section of a semiconductor column extending from the main surface plane into the semiconductor substrate; forming an insulator structure surrounding at least a second section of the semiconductor column between the main surface plane and the first section in planes parallel to the main surface plane; removing the second section of the semiconductor column; and forming a contact structure extending from the main surface plane to the doped region, wherein the contact structure includes a fill structure and a contact layer, the contact layer formed from a metal semiconductor alloy and directly adjoining the doped region and the fill structure formed from a metal and/or a conductive metal compound.

20 Claims, 13 Drawing Sheets

(51) Int. Cl.
    *H01L 29/06*     (2006.01)
    *H01L 29/10*     (2006.01)
    *H01L 29/66*     (2006.01)
    *H01L 29/78*     (2006.01)
    *H01L 27/088*     (2006.01)
    *H01L 29/417*     (2006.01)
    *H01L 21/8234*     (2006.01)
    *H01L 29/40*     (2006.01)

(52) U.S. Cl.
CPC ...... *H01L 29/0696* (2013.01); *H01L 29/1095* (2013.01); *H01L 29/41766* (2013.01); *H01L 29/45* (2013.01); *H01L 29/66734* (2013.01); *H01L 29/7398* (2013.01); *H01L 29/7809* (2013.01); *H01L 29/407* (2013.01); *H01L 29/7397* (2013.01)

(56) References Cited

U.S. PATENT DOCUMENTS

| | | |
|---|---|---|
| 9,006,820 B2 | 4/2015 | Tsuchiko |
| 9,287,384 B2 | 3/2016 | Tsuchiko |
| 9,490,358 B2 | 11/2016 | Loechelt et al. |
| 2004/0097027 A1 | 5/2004 | Park |
| 2014/0167144 A1 | 6/2014 | Tsuchiko |
| 2014/0252473 A1 | 9/2014 | Loechelt et al. |
| 2014/0252484 A1 | 9/2014 | Loechelt et al. |
| 2014/0291762 A1 | 10/2014 | Korec et al. |
| 2015/0061054 A1 | 3/2015 | Kim et al. |
| 2015/0171210 A1 | 6/2015 | Loechelt et al. |
| 2015/0214335 A1 | 7/2015 | Tsuchiko |
| 2015/0236085 A1 | 8/2015 | Dong et al. |

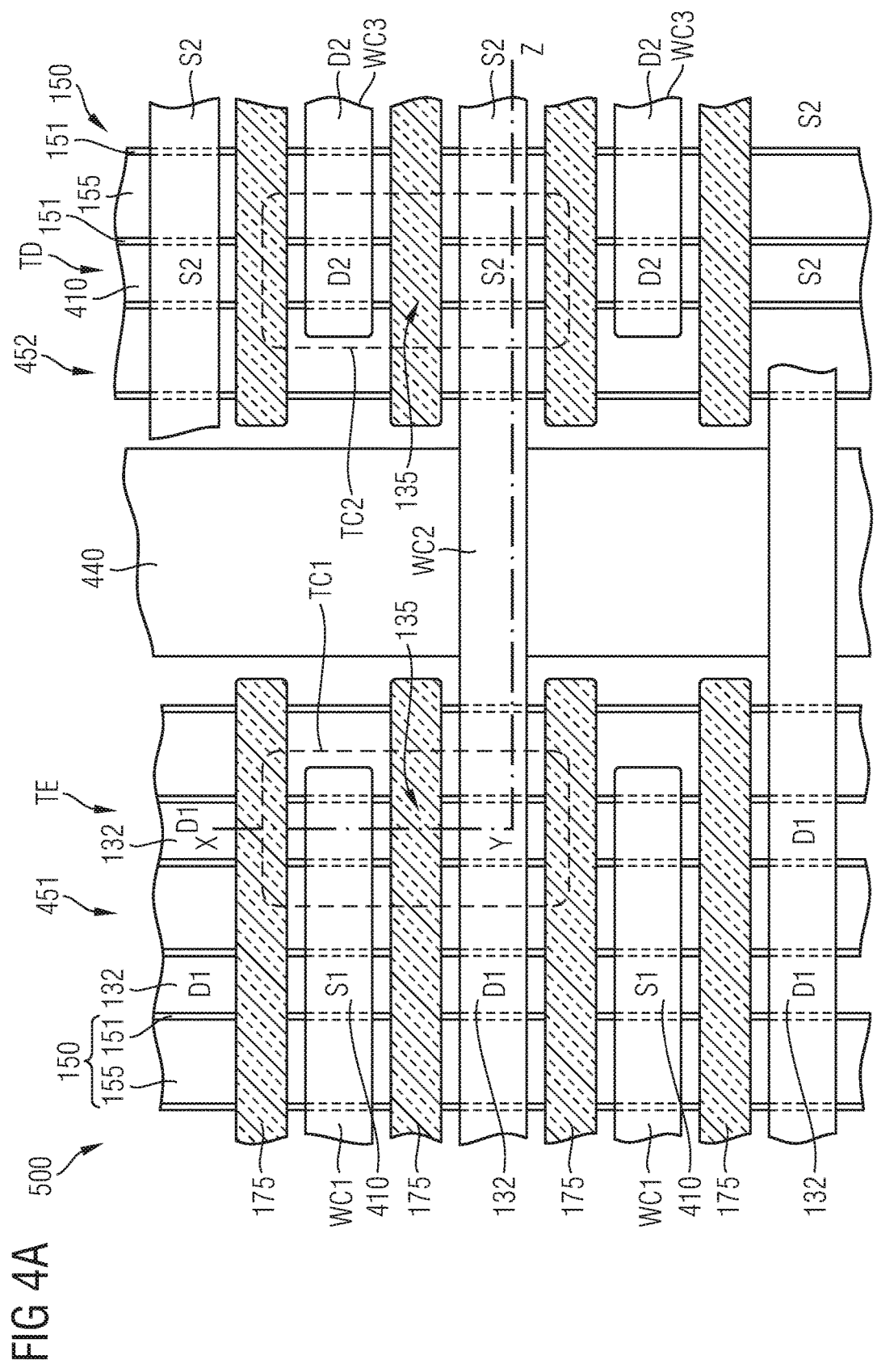

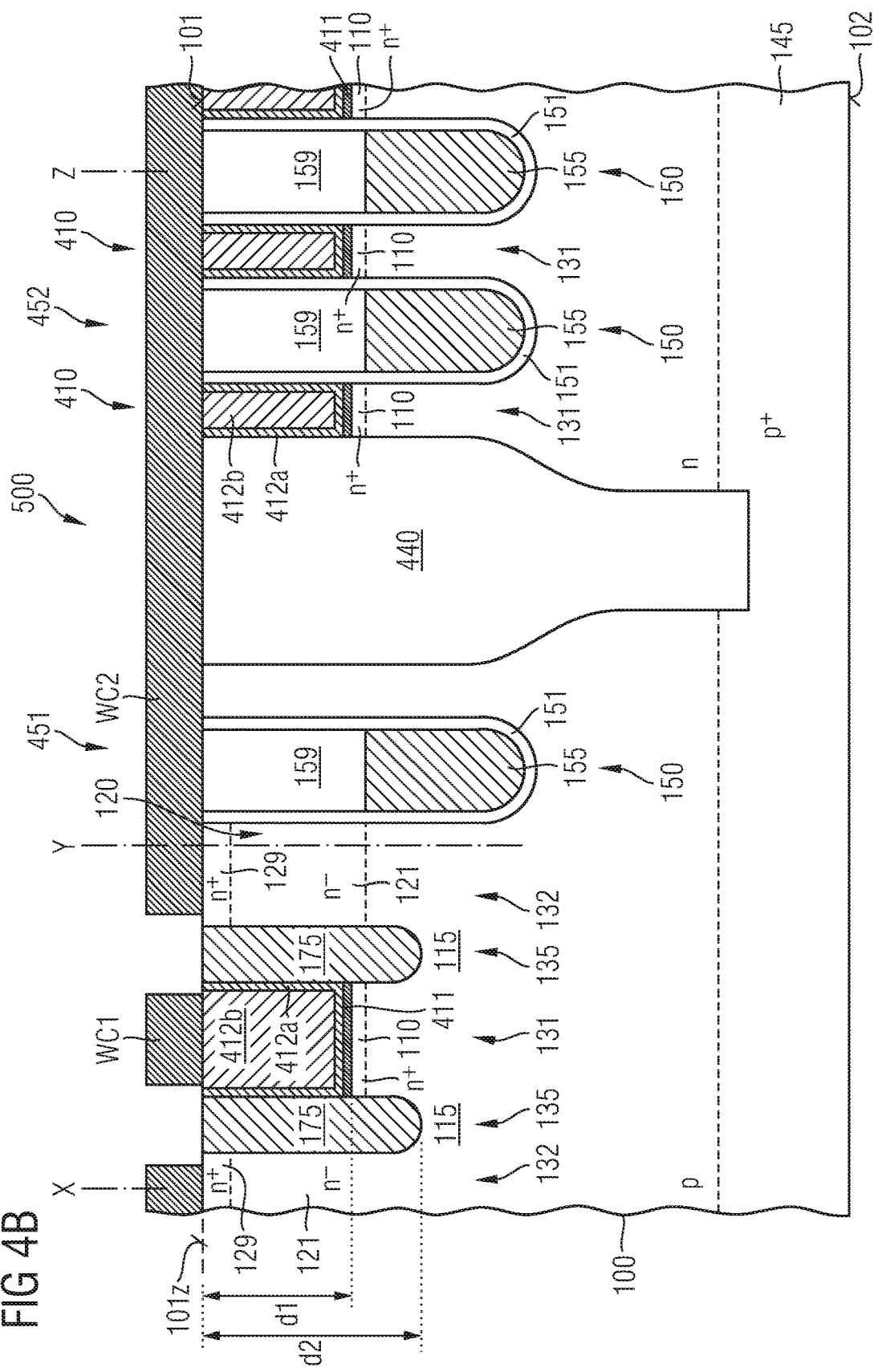

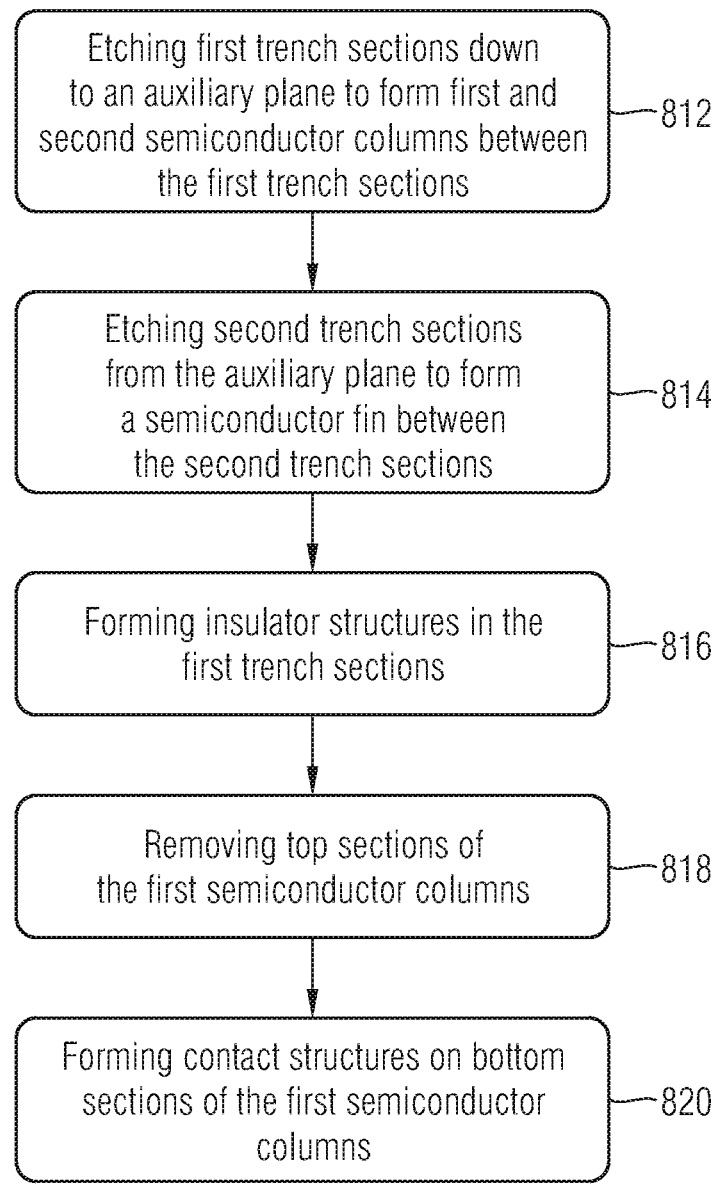

METHODS OF MANUFACTURING A SEMICONDUCTOR DEVICE WITH A BURIED DOPED REGION AND A CONTACT STRUCTURE

TECHNICAL FIELD

The application refers to semiconductor devices, for example power semiconductor switches as well as methods of manufacturing semiconductor devices.

BACKGROUND

Integrated power semiconductor devices typically include a drift zone between a voltage-controlled channel/body region and a drain region. The wider the drift zone is, the higher is the blocking voltage the semiconductor device sustains, wherein increasing the drift zone width also increases the on-state resistance RDSon of the semiconductor device. In vertical power semiconductor devices with a load current flow between a front side and a rear side of the semiconductor device, the thickness of a semiconductor body is adjusted to the nominal blocking voltage of the semiconductor device. Lateral power semiconductor devices may integrate two or more transistor blocks, wherein the transistor blocks are formed side-by-side in the same semiconductor body and load paths of the transistor blocks are electrically arranged in series.

There is a need to improve the characteristics of semiconductor devices, for example power semiconductor devices without load electrodes on the rear side and/or with two or more transistor blocks whose load paths are electrically arranged in series.

SUMMARY

According to an embodiment, a semiconductor device includes a buried doped region at a first distance to a main surface plane of a semiconductor body. A contact structure extends from the main surface plane to the doped region. The contact structure includes a fill structure from a metal or a conductive metal compound and a contact layer from a metal-semiconductor alloy and directly adjoining the doped region. An insulator structure surrounds the contact structure in cross-sections parallel to the main surface plane.

According to another embodiment a semiconductor device includes a semiconductor fin at a distance to a main surface plane in a semiconductor body and including a channel/body region. A first semiconductor column spaced from the main surface plane adjoins the semiconductor fin and includes a source region forming a first homojunction with the channel/body region. A contact structure extends from the main surface plane to the first semiconductor column and includes a contact layer from a metal-semiconductor alloy. The contact layer directly adjoins the first semiconductor column. The contact structure further includes a fill structure from a metal or a conductive metal compound.

According to a further embodiment a method of manufacturing a semiconductor device includes forming a doped region in a semiconductor substrate at a first distance to a main surface plane of the semiconductor substrate. The doped region is formed in a first section of a semiconductor column extending from the main surface plane into the semiconductor substrate. An insulator structure is formed that surrounds a second section of the semiconductor column between the main surface plane and the first section in cross-sectional planes parallel to the main surface plane. The second section of the semiconductor column is removed, wherein the doped region is exposed. A contact structure is formed that extends from the main surface plane to the doped region. The contact structure includes a fill structure made from a metal or a conductive metal compound as well as a contact layer from a metal-semiconductor alloy. The contact layer directly adjoins the doped region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 4A is a schematic layout of a portion of a semiconductor device in accordance with an embodiment providing contact structures for buried source regions.

FIG. 4B is a schematic vertical cross-sectional view of a portion of the semiconductor device of FIG. 4A along line X-Y-Z.

FIG. 7B is a simplified flowchart for illustrating a method of manufacturing a semiconductor device according to an embodiment related to a contact structure for buried source regions.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first, state and a high-ohmic electric decoupling in a second state.

The Figures illustrate relative doping concentrations by indicating "−" or "+" next to the doping type "n" or "p". For example, "$n^-$" means a doping concentration which is lower than the doping concentration of an "n"-doping region while an "$n^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
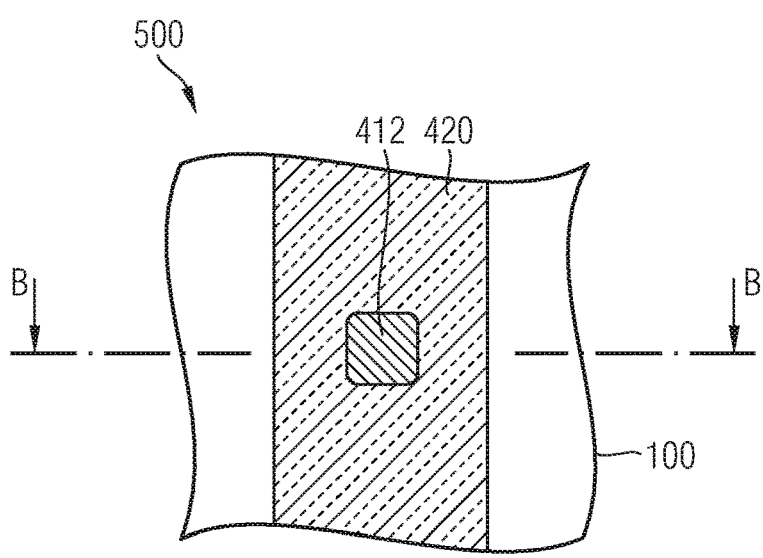
FIG. 1A is a schematic horizontal cross-sectional view parallel to a main surface plane through a portion of a semiconductor device with a contact structure according to an embodiment.
Figure 1B:
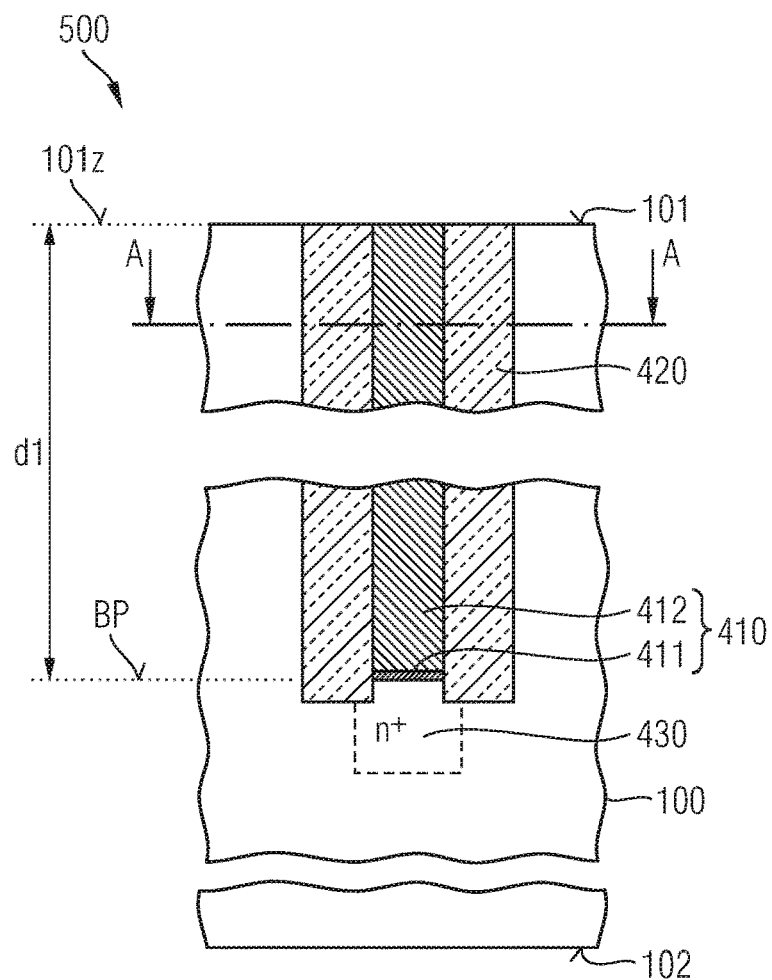
FIG. 1B is a schematic vertical cross-sectional view perpendicular to the main surface plane through the semiconductor device portion of FIG. 1A along line B-B.
Figure 1C:
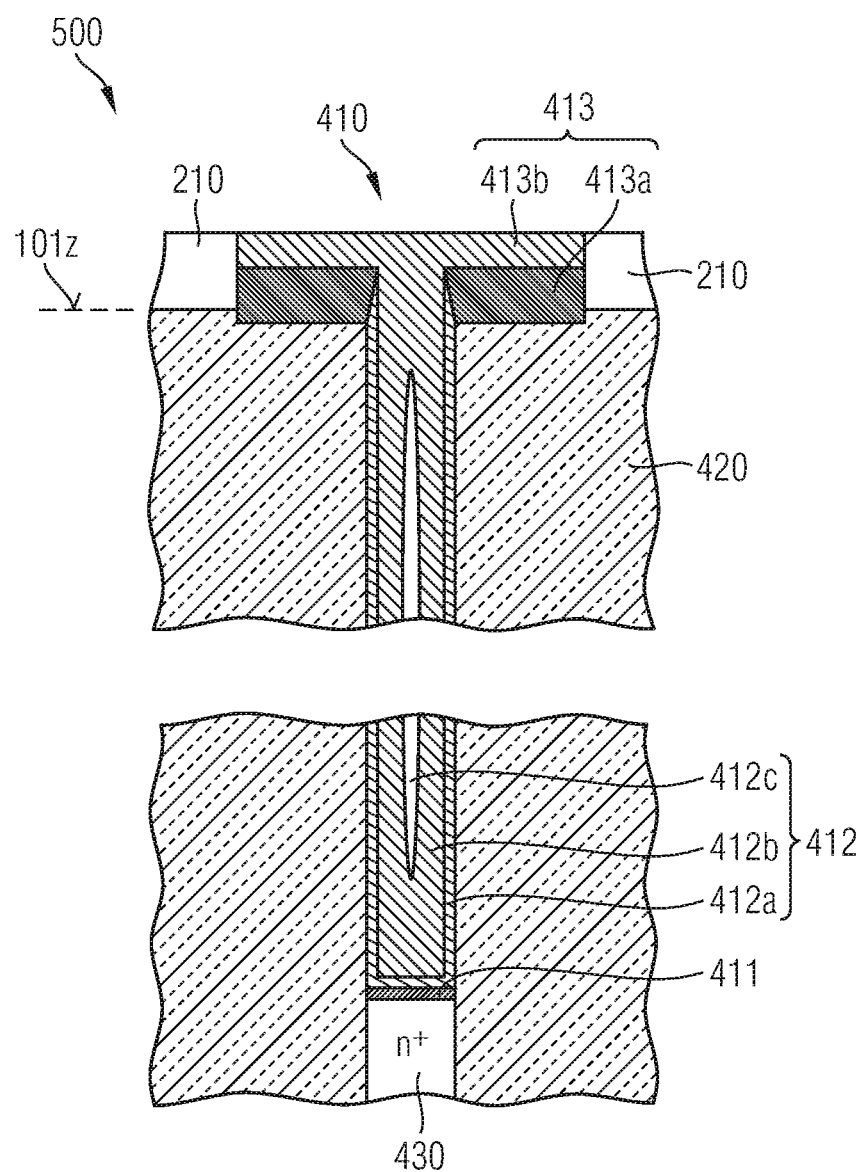
FIG. 1C is a schematic vertical cross-sectional view of a portion of a semiconductor device with a contact structure according to an embodiment including a contact section outside a semiconductor body.

FIGS. 1A to 1C relate to a semiconductor device 500 for rectifying and/or switching currents in power applications with load currents of at least 100 mA, e.g., at least 1 A. The semiconductor device 500 may be or may include, for example, a JFET (junction field effect transistor), an enhancement or depletion IGFET (insulated gate field effect transistor), e.g., a MOSFET (metal oxide semiconductor field effect transistor) in the usual meaning including both IGFETs with metal gate electrodes and with non-metal gate electrodes, or an ADZFET (active drift zone FET) an IGBT (insulated gate bipolar transistor).

The semiconductor device 500 is based on a semiconductor body 100 with a main surface 101 on a front side and a rear side surface 102 on a rear side opposite to the front side. The main surface 101 of the semiconductor body 100 spans a main surface plane 101z, Horizontal directions and extensions are parallel to the main surface plane and vertical directions and extensions are perpendicular to the main surface plane 101z.

The material of the semiconductor body 100 is a single-crystalline semiconductor material, for example silicon (Si), silicon carbide (SiC), germanium (Ge), a silicon-germanium crystal (SiGe), gallium nitride (GaN), gallium arsenide (GaAs) or another $A_{III}B_V$ semiconductor. The semiconductor body 100 may have a rectangular shape at an edge length up to several millimeters.

A buried doped region 430 is formed at a first distance d1 to the main surface plane 101z. The doped region 430 may be n-doped or p-doped and has a dopant concentration which is sufficiently high to form an ohmic contact with a corresponding metal-semiconductor compound. In case the material of the semiconductor body 100 is single-crystalline silicon the corresponding metal-semiconductor compound is a metal silicide and the dopant concentration is at least 1E18 cm$^{-3}$ for an n-conductive doped region 430 and at least 1E16 cm$^{-3}$ for a p-conductive doped region 430. The doped region 430 may be a heavily n-doped or p-doped connection layer that electrically connects buried impurity zones of several identical cell structures, for example IGFET cells. According to other embodiments the doped region 430 may be the source or drain region of a single IGFET cell.

A contact structure 410 extends from the main surface plane 101z to a bottom plane BP at the first distance d1 to the main surface plane 101z. The contact structure 410 includes a contact layer 411 and a fill structure 412. The contact layer 411 directly adjoins the doped region 430 and contains or consists of a metal semiconductor compound. For a semiconductor body 100 based on silicon, the contact layer 411 may contain or consist of a metal silicide, for example, cobalt silicide (CoSi), titanium silicide (TiSi), tantalum silicide (TaSi), platinum silicide (PtSi) or tungsten silicide (WSi).

The fill structure 412 may include one or more layers of different materials, wherein the materials may differ in their chemical composition and/or their physical appearance or structure. For example, the fill structure 412 may include two layers of the same chemical composition but deposited under different deposition conditions. According to an embodiment, the fill structure 421 may include a highly conformal tungsten layer forming vertical sidewalls of the contact structure 412 as well as a less conformal tungsten layer, which fills an inner portion of the contact structure 410 lined by the highly conformal tungsten layer.

A horizontal cross-section of the contact structure 410 may be an elongated stripe with a first horizontal extension that is significantly greater than its second horizontal extension orthogonal to the first horizontal extension. According to other embodiments, the horizontal cross-section may be an approximately rectangular area with the same or similar dimensions in both horizontal directions, for example, a polygon, e.g., a square with or without rounded corners, a circle, an oval or an ellipse.

A vertical extension of the contact structure 410 may be between 100 nm and 5 μm, for example between 1 μm and 3 μm. The smaller horizontal extension (width) or the diameter of the contact structure 410 may be between 20 nm and 200 nm, e.g., in a range from 40 nm to 80 nm. An aspect ratio of the vertical extension of the contact structure 410 to the smaller one of the horizontal dimensions is at least 10:1, e.g., at least 35:1.

An insulator structure 420 completely surrounds the contact structure 410 in cross-sectional planes parallel to the main surface plane 101z. The insulator structure 420 may have a smaller or a greater vertical extension than the contact structure 410. According to the illustrated embodiment, the insulator structure 420 extends from the main surface plane 101z to beyond the contact layer 411. The insulator structure 420 may contain or consist of a semiconductor oxide, for example silicon oxide, such as thermally-grown silicon oxide or deposited silicon oxide or both, a semiconductor nitride, for example silicon nitride, or a semiconductor oxynitride, for example a silicon oxynitride. The insulator structure 420 may have a uniform vertical extension or may have different vertical extensions on different sides of the contact structure 410.

The contact structure 410 allows a low-ohmic connection of the buried doped region 430 to conductive structures at the front side of the semiconductor body 100. The contact structure 410 uses metals and suitable deposition processes for metals forming silicides at the bottom of trenches with high aspect ratio as well as suitable materials for filling narrow trenches at high aspect ratios.

FIG. 1C refers to a contact structure 410 with a contact layer 411, a multi-part fill structure 412 and an auxiliary contact section 413.

The contact layer 411 is a metal silicide layer, for example a TiSi layer, with a thickness of at least 1 nm, e.g. at least 10 nm and at most 100 nm. The fill structure 412 may include a highly conformal tungsten layer 412a extending along a sidewall of the contact structure 410, for example along the insulator structure 420. A coarser grained tungsten 412b may fill a portion of the contact structure 410 surrounded by the conformal tungsten layer 412a and may spare one or more voids 412c, which may be filled with a fluid, for example ambient air or process gas.

The auxiliary contact section 413 may include a first contact section 413a from the metal that forms the metal silicide of the contact layer 411, for example titanium (Ti). The first contact section 413a may be formed around the fill structure 412 on a plane parallel to the main surface plane 101z. A layer thickness of the first contact section 413a may be significantly greater than the layer thickness of the contact layer 411. A second contact section 413b may contain or consist of the one or more materials of the fill structure 412. The horizontal extension of the auxiliary contact section 413 may be defined by an opening in a dielectric mask, which is used to locally recess a sacrificial material that is replaced with the contact structure 410 in the course of manufacturing, e.g., the material of the semiconductor body 100. The material of the dielectric mask may be selectively removable against the material of the insulator structure 420. For example, the material of the dielectric mask may be a silicon nitride. The dielectric mask may form or may be replaced with a portion of a dielectric structure 210 partially covering the main surface in the semiconductor device 500.

Figure 2A:
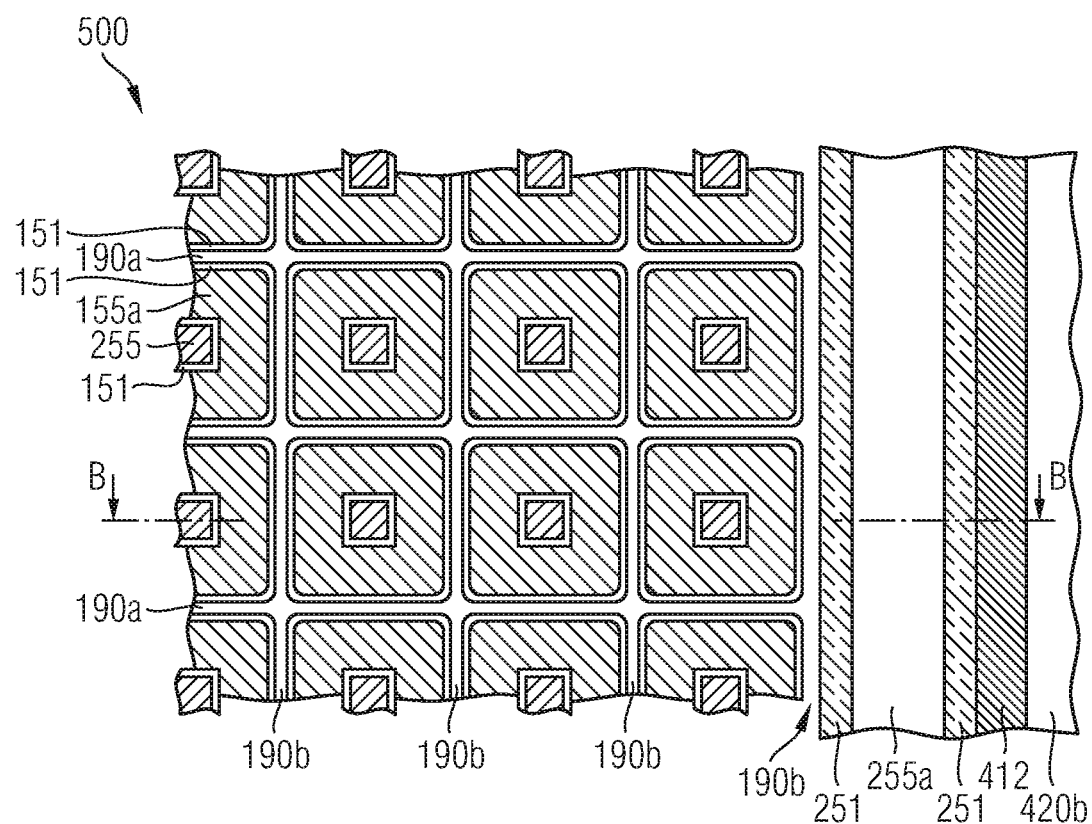
FIG. 2A is a schematic horizontal cross-sectional view of a portion of a semiconductor device in accordance with an embodiment related to a contact structure for a buried drain connection layer.
Figure 2B:
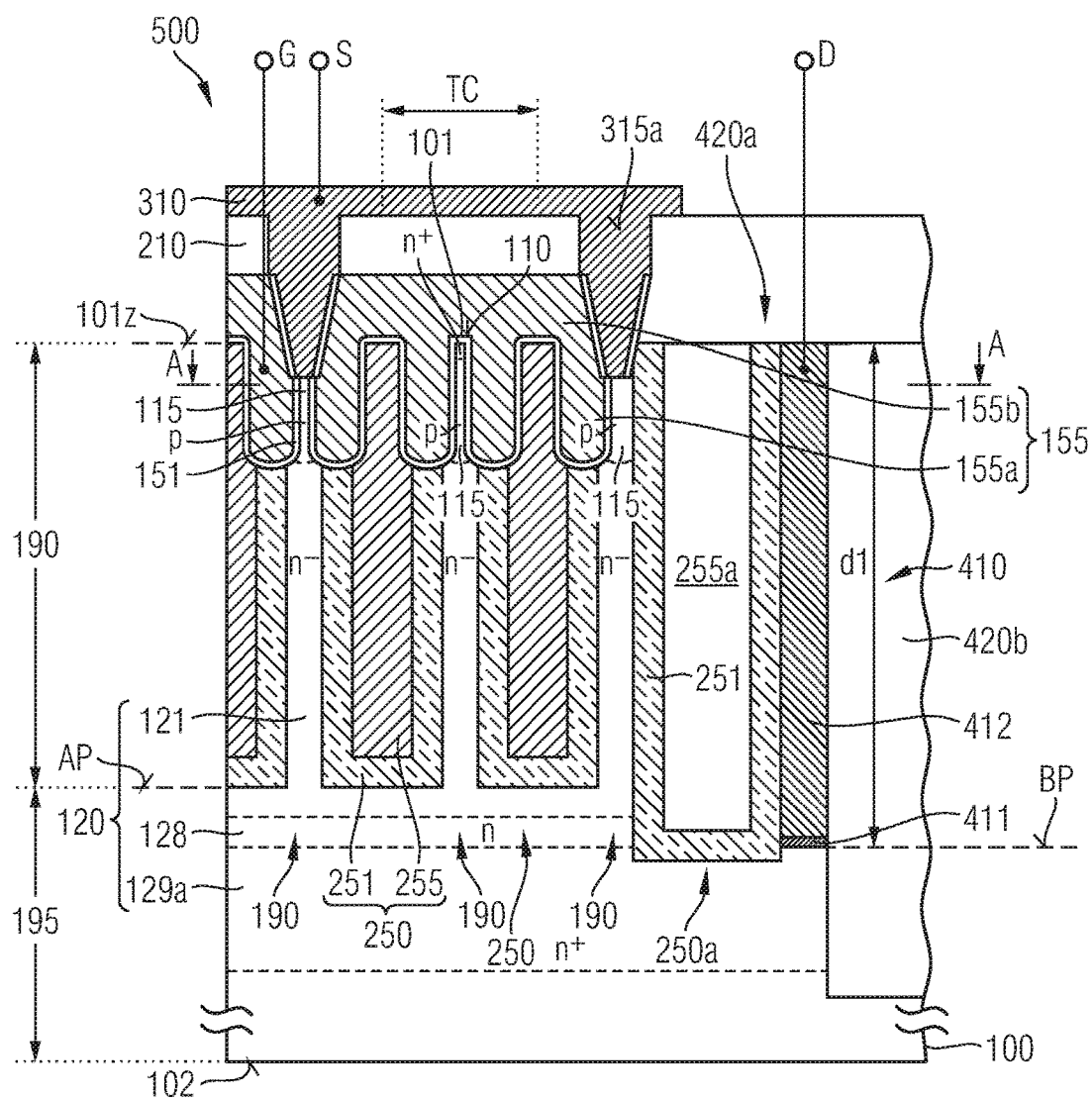
FIG. 2B is a schematic vertical cross-sectional view of the semiconductor device portion of FIG. 1B along line B-B.

FIGS. 2A and 2B refer to a semiconductor device 500 with transistor cells TC, which may be JFET or IGFET cells. Accordingly, the semiconductor device 500 may be a JFET, an IGFET, an ADZFET or a device including, in addition to the transistor cells TC, further circuits, for example a gate driver or a control logic circuit.

The semiconductor device 500 includes a semiconductor body 100 with a main surface in a main surface plane 101z on the front side of the semiconductor device 500 and a rear side surface 102 at a rear side opposite to the front side. As regards further details of the semiconductor body 100, reference is made to the description of FIGS. 1A to 1C.

On the front side of the semiconductor body 100 portions of the semiconductor body 100 form semiconductor ridges 190 extending between the main surface 101 and an auxiliary plane AP. Field electrode structures 250 separate the semiconductor ridges 190 in one or both horizontal directions.

The semiconductor ridges 190 may have the same ridge width, which may be in a range from 10 nm to 200 nm. The width of the field electrode structures 250 corresponds to the distance between the semiconductor ridges 190 and may be in a range from 30 nm to 300 nm. A pitch (center-to-center distance) of neighboring semiconductor ridges 190 may be in a range from 40 nm to about 1 µm.

According to an embodiment, the semiconductor ridges 190 are stripes of a same ridge width arranged at regular distances. According to the illustrated embodiment, the semiconductor device 500 includes first semiconductor ridges 190a extending along a first horizontal direction and second semiconductor ridges 190b extending along a second horizontal direction intersecting the first horizontal direction.

Source regions 110 directly adjoining the main surface 101, channel/body regions 115 separated from the main surface 101 by the source regions 110, and at least portions of a drain region 120 including a weakly doped drift zone 121 are formed in the semiconductor ridges 190 between the main surface 101 and the auxiliary plane AP.

The source regions 110 and the drain region 120 have the same, first conductivity type. The channel/body regions 115 may have the same, first conductivity type or may have the second conductivity type, which is complementary to the first conductivity type.

The illustrated embodiment refers to enhancement n-FET transistor cells TC with n-conductive source regions 110, an n-conductive drain region 120 as well as p-conductive channel/body regions 115. According to an embodiment referring to depletion n-FET transistor cells TC, the channel/body regions 115 are n-conductive. For p-FET transistor cells TC the first conductivity type is the p-type.

First sections of the semiconductor ridges 190, which directly adjoin the main surface 101, include at least the source regions 110 and the channel/body regions 115 and may be narrower than second sections of the semiconductor ridges 190 between the first sections and the auxiliary plane AP. The second sections 190b include at least portions of the drift zone 121.

The field electrode structures 250 are arranged between the second sections of the semiconductor ridges 190 and include a field electrode 255 and a field dielectric 251 electrically insulating the field electrode 255 from the material of the semiconductor ridges 190 as well as from a contiguous portion 195 of the semiconductor body 100 between the auxiliary plane AP and the rear side surface 102. The field electrodes 255 may consist of or contain a heavily doped polycrystalline silicon, a metal-semiconductor compound, for example a silicide, and/or a metal, a metal alloy or a metal nitride.

The field dielectric 251 contains or consists of a semiconductor oxide, for example silicon oxide such as thermally-grown silicon oxide or deposited silicon oxide, a semiconductor nitride, for example silicon nitride or a semiconductor oxynitride, for example a silicon oxynitride.

First gate electrode portions 155a of a gate electrode 155 are arranged on opposing sides of the first sections of the semiconductor ridges 190, wherein the first gate electrode portions 155a surround upper portions of the field electrode structures 250 arranged between the neighboring semiconductor ridges 190. A second, contiguous gate electrode portion 155b of the gate electrode 155 connects the first gate electrode portions 155a. The gate electrode 155 is electrically connected or coupled to a gate terminal G. The gate electrode 155 may contain or consist of a heavily doped polycrystalline silicon, a metal, a metal-semiconductor compound, for example a silicide, a metal nitride such as tantalum nitride (TaN) or titanium nitride (TiN) and/or a metal alloy.

FET-type transistor cells TC include gate dielectrics 151 formed at least along the first sections of the semiconductor ridges 190. JFET-type transistor cells TC are devoid of a gate dielectric and the gate electrode 155 directly adjoins to the first sections of the semiconductor ridges 190.

The gate dielectrics 151 may contain or consist of a semiconductor oxide, for example a thermally grown or deposited silicon oxide, a semiconductor nitride, for example a silicon nitride or a semiconductor oxynitride, for example silicon oxynitride.

A dielectric structure 210 separates a first load electrode 310 from the gate electrode 155. The dielectric structure 210 may include one or more layers of dielectric materials, for example thermally grown or deposited silicon oxide, or a silicon oxide deposited by using tetraethylorthosilicate as precursor material, a silicate glass, for example PSG (phosphorus silicate glass), BSG (boron silicate glass), or BPSG (boron phosphorus silicate glass).

First contact plugs 315a extend from the first load electrode 310 through openings in the dielectric structure 210 down to or into the semiconductor ridges 190. The first contact plugs 315a are spatially separated along the semiconductor ridges 190 and extend at least partly down to at least the homojunction between the source region 110 and the channel/body region 115 of the concerned semiconductor ridge 190.

Second contact plugs may extend through further openings in the dielectric structure 210 and may electrically connect the field electrodes 255 with, for example, the first load electrode 310.

The first load electrode 310 may form a first load terminal, e.g., a source terminal S of the semiconductor device 500 or may be electrically connected to the first load terminal.

The contiguous portion 195 of the semiconductor body 100 between the semiconductor ridges 190 and the rear side surface 102 may include a contiguous drift zone portion directly adjoining the auxiliary plane AP. According to an embodiment, a field stop zone 128 may be formed in the contiguous portion 195, wherein a dopant concentration in the field stop zone 128 exceeds by at least ten times a dopant concentration in the drift zone 121. A heavily doped contiguous drain connection layer 129a is formed between the auxiliary plane AP and the rear side surface 102 in the vertical projection of the transistor cells TC. In case the semiconductor body 100 is formed from silicon, a dopant concentration in the drain connection layer 129a may be at least 1E18 cm$^{-3}$. The drain connection layer 129a conducts a drain current of the transistor cells TC assigned to the same cell area to a region of the semiconductor body 100 outside the cell area with the transistor cells TC.

A contact structure 410 extends from the main surface plane 101z to the drain connection layer 129a. The contact structure 410 includes a contact layer 411 directly adjoining the drain connection layer 129a. The contact layer 411 contains or consists of a metal-semiconductor compound, e.g., a metal silicide. The contact structure 410 further includes a fill structure 412 from a metal or a conductive metal compound other than the metal compound forming the contact layer 411. For further details of the contact structure 410, reference is made to the description of FIGS. 1A to 1C.

An insulator structure 420 may extend from the main surface plane 101z into the semiconductor body 100 and surrounds the contact structure 410 in planes parallel to the main surface plane 101z. The insulator structure 420 may include a first insulator section 420a oriented to the transistor cells TC and a second insulator section 420b averted from the transistor cells TC and connected with the first insulator section 420a.

The insulator structure 420 may be a dedicated insulator structure 420 formed independently from the field electrode structures 250. According to the illustrated embodiment, at least the first insulator section 420a may be a portion of a modified field electrode structure 250a including the field dielectric 251 and the field electrode 255 or a modified field electrode 255a which may be electrically connected to the field electrodes 255 or which may be insulated from the field electrodes 255. For example, the modified field electrode 255a may float. According to other embodiments, a dielectric fill, which may include voids, may be provided in lieu of the modified field electrode 255a.

The modified field electrode structure 250a may extend from the main surface plane 101z to the drain connection layer 129a or may extend into the drain connection layer 129a. The modified field electrode structure 250a may be wider than the field electrode structures 250.

The second insulator section 420b may have the same vertical extension as the first insulator section 420a or may cut through the drain connection layer 129a such that the drain connection layer 129a is confined in the horizontal direction. The second insulator section 420b may be a further modified field electrode structure similar to the modified field electrode 255a or a dedicated insulator structure filled exclusively with dielectric materials with or without voids filled with a fluid. For example, the second insulator section 420b may include layers of silicon oxide, silicate glass, for example PSG, BSG, BPSG and/or organic dielectrics, for example polyimide.

The contact structure 410 allows a low ohmic electrical connection from the buried drain connection layer 129a to a drain terminal D, by way of example.

Figure 3A:
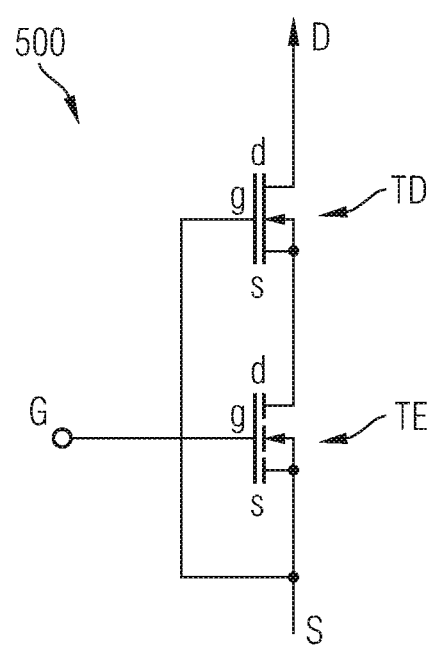
FIG. 3A is a schematic circuit diagram of a semiconductor device according to an embodiment related to transistor blocks in a cascode configuration and a contact structure for a buried drain connection layer.
Figure 3B:
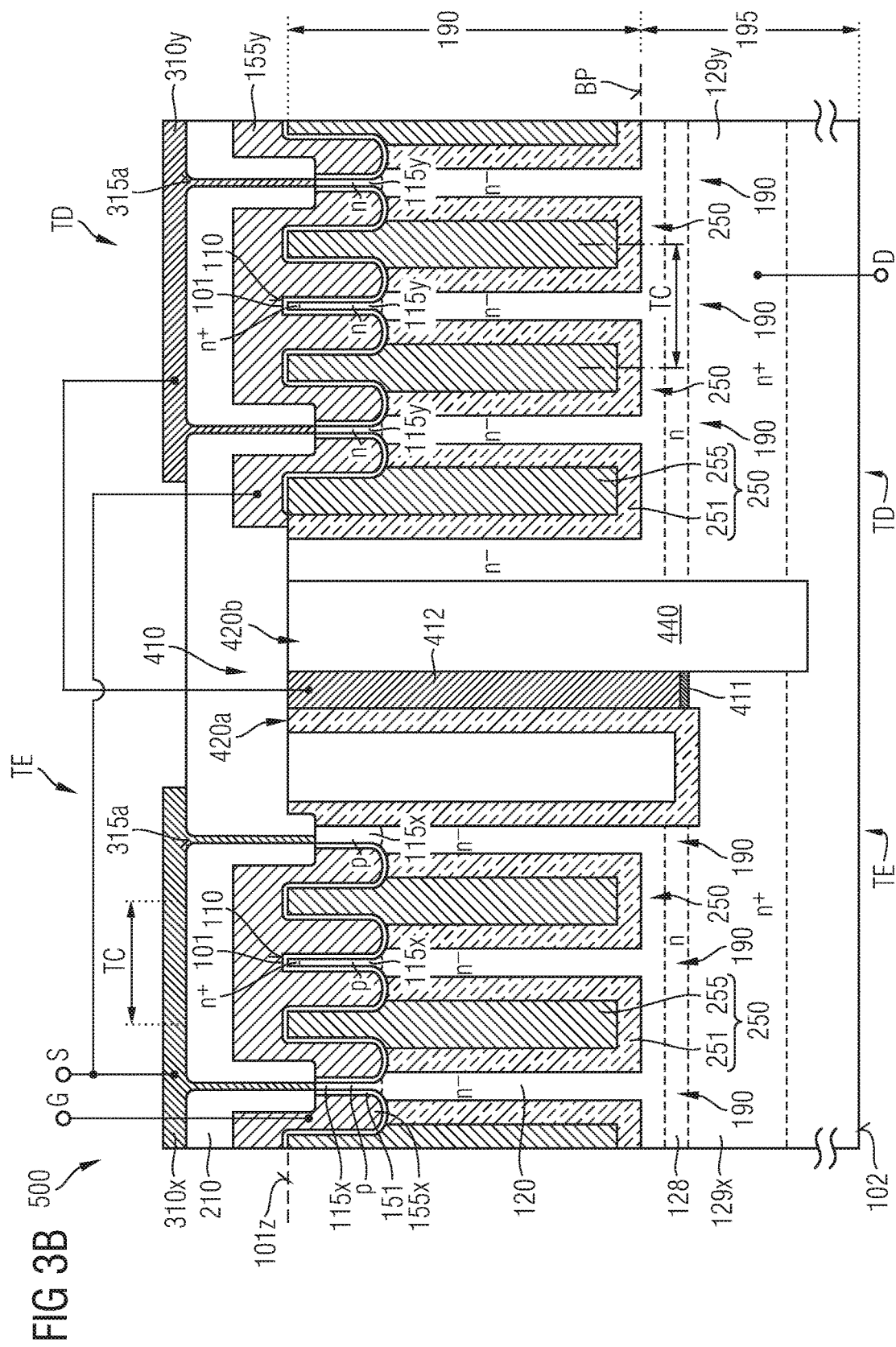
FIG. 3B is a schematic vertical cross-sectional view of a section of the semiconductor device of FIG. 3A.

FIGS. 3A to 3B illustrate a semiconductor device 500 that may include at least two vertical transistor components, e.g., an enhancement IGFET TE and a depletion IGFET TD that are arranged in a cascode configuration. The load paths between the sources s and drains d of the IGFETs TE, TD are arranged in series between drain and source terminals D, S of the semiconductor device 500. A gate terminal G of the semiconductor device 500 or the output of an integrated gate driver is electrically connected or coupled to the gate electrode g of the enhancement IGFET TE. The source s of the enhancement IGFET TE is electrically connected or coupled to the source terminal S and to the gate electrode g of the depletion IGFET TD. The drain d of the enhancement IGFET TE is electrically connected with the source s of the depletion IGFET TD. The drain electrode d of the depletion IGFET TD is electrically connected to the drain terminal D. In the illustrated embodiment, the IGFETs TD, TE are n-IGFETs. Equivalent considerations apply to p-IGFETs.

In a blocking mode, each of the IGFETs TE, TD, sustains a portion of the total blocking voltage. In the conductive mode, the two IGFETs TE, TD have the load paths electrically arranged in series and provide an on-state resistance which is lower or at least in the range of the on-state resistance of a single IGFET having a comparable blocking voltage capability. Since the total blocking voltage can be modified by the number of IGFETs electrically arranged in series and integrated in the same semiconductor die, device parameters like blocking voltage capability and on-state resistance for vertical IGFET designs can be modified without modifying the thickness of a semiconductor body 100 by expensive grinding and polishing processes.

FIG. 3B shows a vertical cross-sectional view of the two IGFETs TE, TD of FIG. 3A.

Channel/body regions 115x of the enhancement IGFET TE are p-conductive and channel/body regions 115y of the depletion IGFET TD are n-conductive. A first drain connection layer 129x of the enhancement IGFET TE is electrically separated from a second drain connection layer 129y of the depletion IGFET TD. For example, a device separation structure 440 may extend from the main surface plane 101z into the semiconductor body 100 and may cut through the drain connection layers 129x, 129y. A first gate electrode 155x of the enhancement IGFET TE is electrically connected or coupled to a gate terminal G. A first source electrode 310x of the enhancement IGFET TE may form or may be electrically connected to a source terminal S and to a second gate electrode 155y of the depletion IGFET TD. The second drain connection layer 129y of the depletion IGFET TD is electrically connected or coupled to a drain terminal D.

The contact structure 410 is a portion of a connection structure electrically connecting the first drain connection layer 129x with the second source electrode 310y of the depletion IGFET TD. An insulator structure 420 embedding the contact structure 410 in cross-sectional planes parallel to the main surface plane 101z may include a first insulator section 420a oriented to the transistor cells TC of the enhancement IGFET TE and a second insulator section 420b averted from the transistor cells TC. The second insulator section 420b may be formed by the device separation structure 440. The contact structure 410 may include a contact layer 411 and a fill structure 412 as well as an auxiliary contact section as described in detail with reference to FIGS. 1A to 1C.

FIGS. 4A and 4B refer to a semiconductor device 500 with transistor cells TC based on buried source regions 110 and with contact structures 410 extending from a main surface plane 101z of a semiconductor body 100 to the buried source regions 110.

The semiconductor body 100 may include a first cell field 451 including first transistor cells TC1 assigned to a first semiconductor element, for example an enhancement n-IGFET TE and a second cell field 452 with second transistor cells TC2 assigned to a second semiconductor element, for example a depletion n-IGFET TD, wherein the n-IGFETs TE, TD may be arranged in a cascode configuration as illustrated in FIG. 3A.

In each cell field 451, 452 a respective transistor cell TC1, TC2 includes a semiconductor fin 135 formed at a second distance d2 to a main surface 101 of the semiconductor body 100. The semiconductor fin 135 includes a channel/body region 115, which is n-conductive for the depletion n-IGFET TD and which is p-conductive for the enhancement n-IGFET TE.

A first semiconductor column 131, which is spaced from a main surface plane 101z, directly adjoins the semiconductor fin 135 and includes a source region 110 that forms a first homojunction with the channel/body region 115. The source region 110 is formed at a distance to the main surface plane 101z.

At a side of the semiconductor fin 135 opposite to the first semiconductor column 131 a second semiconductor column 132 directly adjoins the semiconductor fin 135 and includes a drain region 120 that forms a second homojunction with the channel/body region 115. The first and second homojunctions may be formed within the semiconductor fin 135 or within the respective semiconductor column 131, 132, wherein in the former case the channel/body region 115 is exclusively formed in the semiconductor fin 135 and in the latter case the channel/body region 115 extends into the first and/or second semiconductor column 131, 132.

FIG. 4A shows a schematic plan view of the arrangement of source regions S1 and drain regions D1 in the first cell field 451 and the source regions S2 and the drain regions D2 in the second cell field 452 according to an embodiment.

The first and second cell fields 451, 452 may be arranged along a first horizontal axis. Within each of the both cell fields 451, 452 the transistor cells TC1, TC2 may be arranged in a matrix, wherein the first and second source regions S1, S2 of some of the transistor cells TC1, TC2 of the n-IGFETs TE, TD are arranged along the same first horizontal axis. With respect to the concerned source regions S1, S2, the corresponding first and second drain regions D1, D2 are arranged along a second horizontal axis orthogonal to the first horizontal axis. The first source regions S1 of the first cell field 451 may be arranged in the projection of the second drain regions D2 of the second cell field 452 along the first horizontal direction. The second source regions S2 may be arranged in the projection of the first drain regions D1 along the first horizontal direction.

Within each cell field 451, 452 gate electrode structures 150 including gate electrodes 155 extend along the second horizontal direction between the semiconductor fins 135. The gate electrode structures 150 further include gate dielectrics 151 electrically separating the gate electrodes 155 from the surrounding semiconductor material of the semiconductor body 100, Separation structures 175 separate neighboring first and second semiconductor columns 131, 132. The gate electrode structures 150 may include dielectric fill structures 159 separating the gate electrodes 155 from, the main surface plane 101z.

First wiring connections WC1 extend along the first horizontal direction and form portions of electrical connections between the first source regions S1, which are arranged along the first horizontal direction in the first cell field 451, and a source connector. Second wiring connections WC2 form portions of electrical connections between the first drain regions D1, which are arranged in the first cell field 451 along the first horizontal direction, and the second source regions S2 in the second cell field 452. Third wiring connections WC3 form portions of electrical connections between second drain regions D2, which are arranged in the second cell field 452 along the first horizontal direction, and, for example, a drain connector or with source regions of a further cell field assigned to a further transistor block integrated in the same semiconductor body 100. The source connector may be electrically connected with a source terminal of the semiconductor device 500. The drain connector may be electrically connected with the drain terminal.

According to FIG. 41B, the drain regions 120 may include a weakly doped drift region 121 forming the homojunction with the channel/body region 115 as well as a heavily doped drain contact region 129 forming an ohmic contact with the respective wiring connection WC2, WC3, respectively.

A first transistor cell TC1 of the enhancement IGFET TE includes a channel/body region 115 with a conductivity type opposite to the conductivity type of the source regions 110. The channel/body region 115 forms pn junctions with the source region 110 and the drain region 120. In a second transistor cell TC2 of the depletion IGFET TD the channel/body region 115 has the same conductivity type as the source region 110 and may form unipolar homojunctions with the source region 110 and the drain region 120.

The semiconductor body 100 may further include a substrate layer 145 between the channel/body regions 115 and the rear side surface 102. A conductivity type of the substrate layer 145 may be opposite to a conductivity type of the source regions 110. The semiconductor body 100 may include further doped zones and layers, for example further pn junctions for element separation.

In the absence of a potential, a current flows between the source region 110 and the drain region 120 of each second transistor cell TC2 of the depletion IGFET TD. When a suitable potential is applied, the gate electrode 155 depletes a channel portion between the source region 110 and the drain region 120 from mobile charge carriers such that the second transistor cells TC2 are switched off and no current flows between the source region 110 and the drain region 120. The first transistor cells TC1 of the enhancement IGFET TE are switched off as long as no voltage is applied to the gate electrode 155. When a suitable potential is applied to the gate electrode 155, the gate electrode 155 generates a conductive channel of minority charge carriers in a channel portion of the channel/body region 115 and the first transistor cell TC1 is conductive.

A device separation structure 440 may be arranged between the first and second cell fields 451, 452, may extend from the main surface plane 101z into the semiconductor body 100 and may have a greater vertical extension than the gate electrode structures 150 and the separation structures 175.

Contact structures 410 as described with regard to FIGS. 1A to 1C extend between the main surface plane 101z and the source regions 110 at a first distance d1 to the main surface plane 101z, wherein the contact structures 440 include a contact layer 411 provided from a metal silicide and a fill structure 412 from a metal or a conductive metal compound. The contact structures 410 may be configured in the above described way and drastically reduce the on-resistance of each transistor cell TC1, TC2 as well as the on-resistance RDSon of the semiconductor device 500.

The first, second and third wiring connection WC1, WC2, WC3 may directly adjoin the main surface 101. According to other embodiments, a dielectric structure 210 is formed between the wiring connections WC1, WC2, WC3 and the semiconductor body 100 and contact plugs 315 extending through openings in the dielectric structure 210 electrically connect the first, second and third wiring connections WC1, WC2, WC3 with the contact structures 410 and the drain regions 120.

Figure 5A:
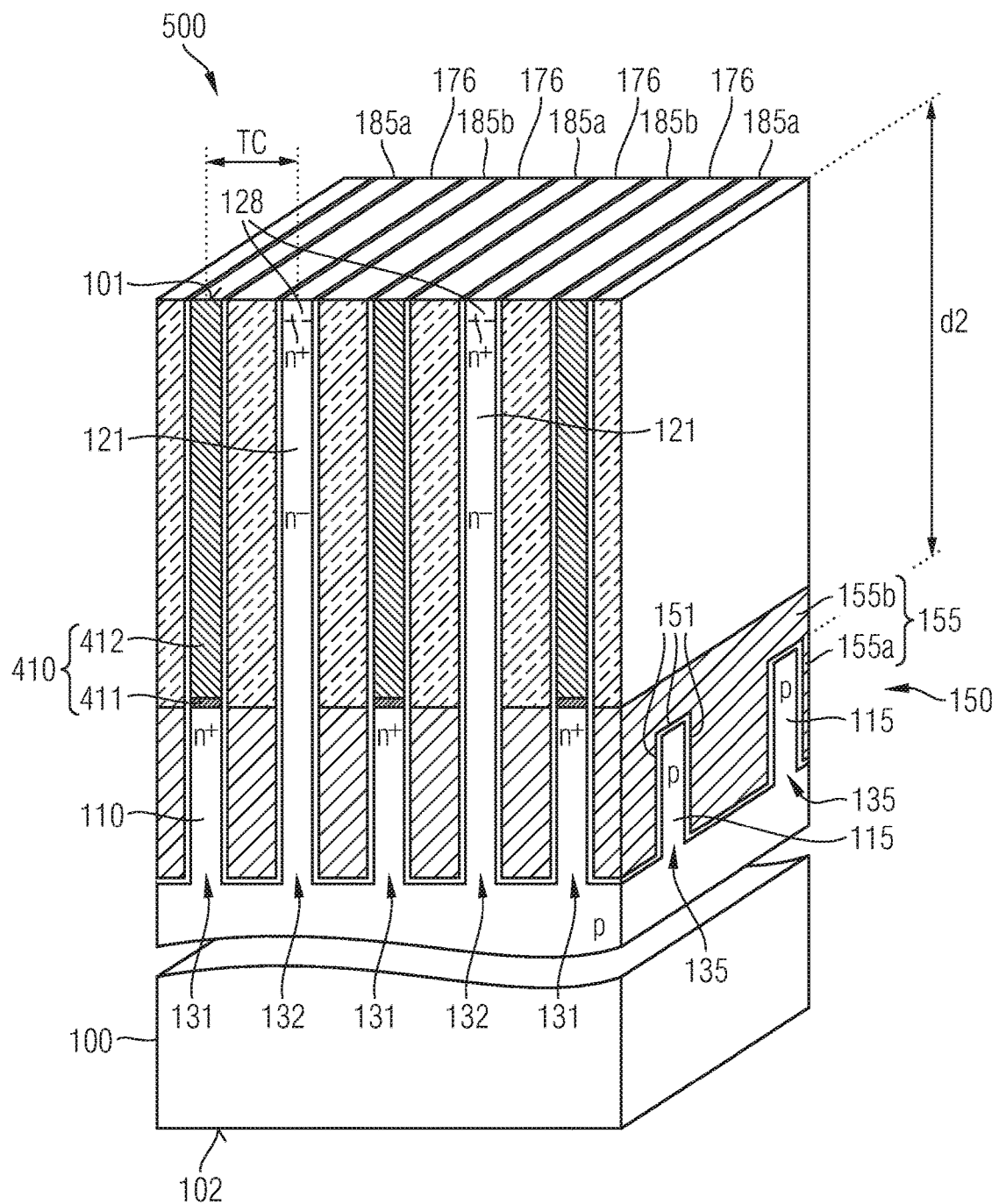
FIG. 5A is a schematic perspective view of a portion of a semiconductor device in accordance with an embodiment related to stripe-shaped contact structures for buried source regions.
Figure 5B:
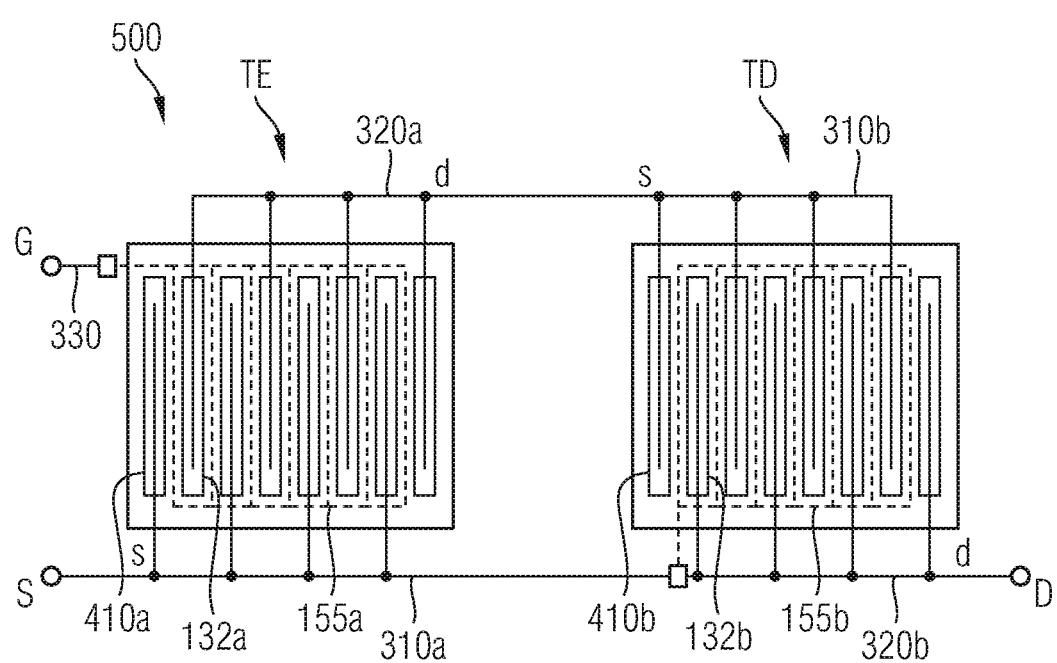
FIG. 5B is a schematic illustration of the layout of the semiconductor device portion of FIG. 5A.

FIGS. 5A and 5B refer to an embodiment with stripe-shaped first and second semiconductor columns 131, 132 and buried semiconductor fins 135 extending orthogonal to first and second semiconductor columns 131, 132.

The first and second semiconductor columns 131, 132 are portions of a semiconductor body 100 and extend along a first horizontal direction. Dielectric separation structures 176 extend from the main surface plane 101z into the semiconductor body 100 and separate top sections of neighboring first and second semiconductor columns 131, 132 from each other. In a second distance d2 to the main surface plane 101z semiconductor fins 135 extend along a second horizontal direction intersecting the first horizontal direction, for example orthogonal to the first horizontal direction. A gate electrode structure 150 includes a gate electrode 155 with first gate electrode portions 155a between the semiconductor fins 135 and a second gate electrode portion 155b arranged between the semiconductor fins 135 and the main surface plane 101z and connecting first gate electrode portions 155a that are arranged between a first semiconductor column 131 and a second semiconductor column 132, In case the transistor cells TC are IGFET cells, the gate electrode structures 150 further include a gate dielectric 151 separating the gate electrode 155 from the surrounding semiconductor material of the semiconductor body 100. Transistor cells of JFET cells are devoid of a gate dielectric. The gate electrode structures 150 are arranged in the vertical projection of the dielectric separation structures 176 and extend between bottom sections of the first and second semiconductor columns 131, 132.

Channel/body regions 115 are formed in the semiconductor fins 135, wherein the channel/body regions 115 may be exclusively formed in the semiconductor fins 135 or may extend into adjoining portions of the first and second semiconductor columns 131, 132, For depletion IGFET-type transistor cells TC, the channel/body zones 115 may nave the same conductivity type as the source regions 110. For enhancement IGFET-type transistor cells TC, the conductivity type of the channel/body zones 115 is opposite to that of the source regions 110.

The first semiconductor columns 131 include source regions 110. The second semiconductor columns 132 include drain regions 120 with a low doped drift zone 121 and a heavily doped drain contact zone 129. The low doped drift zone 121 directly adjoins to the channel/body region 115 and the drain contact zone 129 forms an ohmic contact with a metallic drain connection structure.

A vertical extension of the first semiconductor columns 131 is smaller, greater or approximately equal to the vertical extension of the semiconductor fins 135. The contact structures 410 are formed between the main surface plane 101z and the first semiconductor columns 131 at a first distance d1 to the main surface plane 101z, respectively, wherein each contact structure 410 includes a contact layer 411 from a metal silicide directly adjoining the respective source region 110 as well as a fill structure 412 from a metal or a conductive metal compound.

FIG. 5B shows a schematic layout with an enhancement n-IGFET TE and a depletion n-IGFET TD according to FIG. 5A arranged in a cascode configuration as illustrated in FIG. 3A.

The buried gate electrode 155a of the enhancement n-IGFET TE is electrically connected with a gate metallization 330, which may form or which may be electrically connected to a gate terminal G of the semiconductor device 500. A first wiring connection 310a of the enhancement n-IGFET TE electrically connects a source terminal S with the first contact structures 410 of the enhancement n-IGFET TE and the gate electrode 155b of the depletion n-IGFET TD. A second wiring connection 320a of the enhancement n-IGFET TE may electrically connect the drain contact zones of the enhancement n-IGFET TE with a first wiring connection 310b of the depletion n-IGFET TD. A second wiring connection 320b of the depletion n-IGFET TD electrically connects the drain contact zones 129 in the second semiconductor columns 132 of the depletion n-IGFET TD with a drain terminal D.

Figure 6:
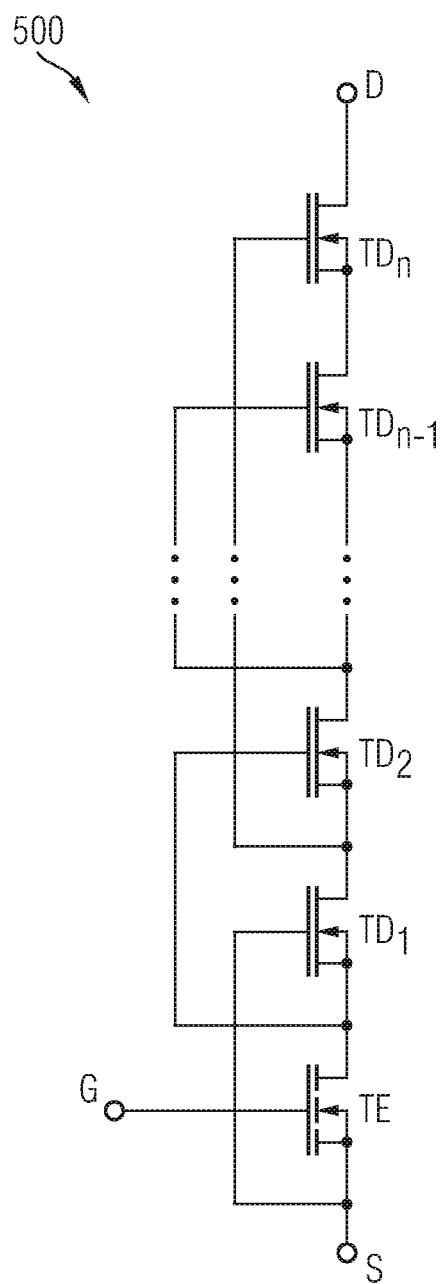
FIG. 6 is a circuit diagram of a semiconductor device according to a further embodiment providing more than two transistor blocks in a cascode configuration.

FIG. 6 refers to a further embodiment with a semiconductor device 500 including more than one depletion n-IGFET TD1, TD2 in a cascode configuration, wherein the connections between the depletion n-IGFETs TD1, TD2 are formed in the same manner as the connection between the enhancement n-IGFET TE and the first depletion n-IGFET TD1 as illustrated in FIGS. 5A and 5B.

Figure 7A:
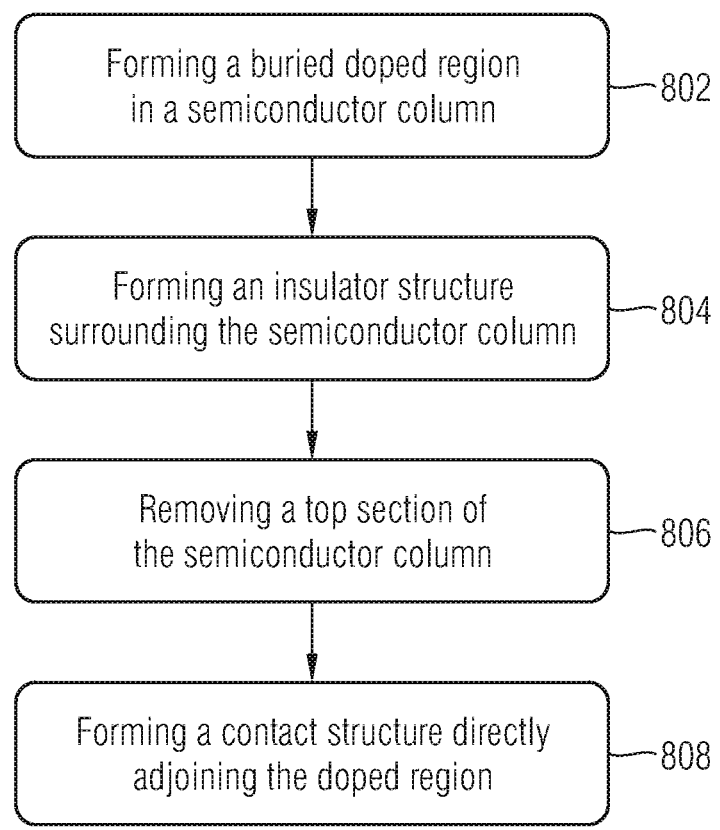
FIG. 7A is a simplified flowchart illustrating a method of manufacturing a semiconductor device according to an embodiment related to a contact structure for buried doped regions.

FIG. 7A refers to a method of manufacturing a semiconductor device. A buried doped region is formed in a semiconductor body at a first distance to a main surface plane of the semiconductor body, wherein the doped region is a section of a semiconductor column extending up to the main surface plane (802). Before or after forming the doped region an insulator structure is formed that surrounds the semiconductor column in planes parallel to the main surface plane (804). A top section of the semiconductor column is removed (806). The doped region may be formed in a first section of the semiconductor column before removal of the top section and is exposed by removal of the top section. According to another embodiment, the doped region may be formed in the exposed first section of the semiconductor column after removal of the top section. A contact structure is formed that extends from the main surface plane to the doped region (808). The contact structure includes a fill structure and a contact layer directly adjoining the doped region. The contact layer is formed from a metal semiconductor alloy and the fill structure is formed from one or more metals and/or conductive metal compound(s).

A temporary trench formed by removing the top section of the semiconductor column may nave a width between 20 nm and 200 nm, for example in the range from 40 nm to 80 nm. The vertical extension of the temporary trench may be between 100 nm and 5 µm, for example form 1 µm to 3 µm. A sputter process may be performed in a way that at least a metal layer with a thickness of at least 2 nm is formed at the bottom of the temporary trench. Then the semiconductor substrate is heated such that the deposited metal forms a silicide with the exposed portion of the first semiconductor column. A fill structure may be provided by using ALD (atomic layer deposition) or PNL (pulsed nucleation layering) of tungsten.

FIG. 7B refers to a further method of manufacturing a semiconductor device. On a main surface, first trench sections are formed down to an auxiliary plane in a semiconductor substrate, wherein sections of the semiconductor substrate between the first trench sections form first and second semiconductor columns (812). The first and second semiconductor columns alternate along at least one horizontal direction parallel to the main surface plane. Starting from the auxiliary plane at the bottom of the first trench sections second trench sections are etched into the semiconductor substrate, wherein sections of the semiconductor substrate between the second trench sections form semiconductor fins connecting neighboring semiconductor columns (814). Insulator structures are formed at least in the first trench sections (816). Top sections of the first semiconductor columns are removed (818). On remaining bottom sections of the first semiconductor columns contact structures are formed (820). The contact structures include a fill structure and a contact layer directly adjoining the second sections of the first semiconductor columns. The contact layer is formed from a metal semiconductor alloy. The fill structure is formed from one or more metals and/or one or more conductive metal compounds.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
    forming a doped region in a semiconductor substrate at a first distance to a main surface plane of the semiconductor substrate, wherein the doped region is a first section of a semiconductor column extending from the main surface plane into the semiconductor substrate;
    forming an insulator structure surrounding at least a second section of the semiconductor column between the main surface plane and the first section in planes parallel to the main surface plane;
    after forming the insulator structure, removing the second section of the semiconductor column; and
    forming a contact structure extending from the main surface plane to the doped region, wherein the contact structure comprises a fill structure and a contact layer, the contact layer formed from a metal semiconductor alloy and directly adjoining the doped region and the fill structure formed from a metal and/or a conductive metal compound.

2. The method of claim 1, wherein the doped region is formed in the first section of the semiconductor column after removing the second section of the semiconductor column.

3. The method of claim 1, further comprising:
    etching first trench sections into the semiconductor substrate from the main surface plane to a base plane, wherein a portion of the semiconductor substrate between the first trench sections forms a portion of the semiconductor column; and
    etching, starting from the base plane, second trench sections into the semiconductor substrate, wherein a portion of the semiconductor substrate between the second trench sections forms a semiconductor fin.

4. The method of claim 1, wherein the insulator structure is formed at least in portions of the first trench sections and the doped region is formed in the semiconductor column.

5. The method of claim 1, wherein the insulator structure vertically extends deeper into the semiconductor substrate than the contact structure, the depth of the insulator structure and the contact structure being measured from the main surface plane of the semiconductor substrate.

6. A method of manufacturing a semiconductor device, the method comprising:
    forming a buried doped region at a first distance from a main surface plane in a semiconductor body;
    forming a contact structure extending from the main surface plane to the doped region, wherein the contact structure comprises a contact layer directly adjoining the doped region and a fill structure, wherein the contact layer is formed from a metal semiconductor alloy and the fill structure comprises a metal or a conductive metal compound; and
    forming an insulator structure surrounding the contact structure in planes parallel to the main surface plane, wherein the insulator structure laterally directly adjoins the contact structure, wherein the insulator structure vertically extends deeper into the semiconductor body than the contact structure, the depth of the insulator structure and the contact structure being measured from the main surface.

7. The method of claim 6, wherein forming the buried doped region comprises:
    forming a buried connection layer connecting source or drain regions of a plurality of transistor cells formed in the semiconductor body.

8. The method of claim 6, further comprising:
forming a semiconductor fin in the semiconductor body in a second distance to the main surface plane, the semiconductor fin comprising a channel region; and
forming a first semiconductor column spaced from the main surface plane and directly adjoining the semiconductor fin, wherein the first semiconductor column comprises the doped region, wherein the doped region forms a first homojunction with the channel region.

9. The method of claim 8, further comprising:
forming a second semiconductor column directly adjoining the semiconductor fin at a side opposite to the first semiconductor column, the second semiconductor column comprising a drain region forming a second homojunction with the channel region.

10. The method of claim 9, wherein the drain region extends from the main surface plane to the semiconductor fin and includes a drift zone forming the second homojunction and a drain contact zone, and wherein a maximum net dopant concentration in the drain contact zone exceeds at least ten times a mean net dopant concentration in the drift zone.

11. The method of claim 9, further comprising:
connecting the semiconductor fin to the first semiconductor column and to the second semiconductor column.

12. The method of claim 9, further comprising:
connecting the first and the second semiconductor columns via at least two semiconductor fins.

13. The method of claim 8, wherein the first homojunction is a pn junction.

14. The method of claim 8, further comprising:
forming a gate electrode structure directly adjoining the semiconductor fin on opposite sides, the gate electrode structure comprising a gate electrode and a gate dielectric separating the gate electrode from the semiconductor body.

15. The method of claim 6, wherein the metal semiconductor alloy is a titanium silicide.

16. The method of claim 6, wherein a width of the contact structure in a direction parallel to the main surface plane is at most 75 nm.

17. The method of claim 16, wherein a ratio between the first distance and the width of the contact structure is at least 10:1.

18. A method of manufacturing a semiconductor device, the method comprising:
forming a semiconductor fin in a semiconductor body at a distance to a main surface plane of the semiconductor body, the semiconductor fin comprising a channel region;
forming a first semiconductor column spaced from the main surface plane and directly adjoining the semiconductor fin, the first semiconductor column comprising a source region that forms a first homojunction with the channel region;
forming a contact structure extending from the main surface plane to the first semiconductor column, wherein the contact structure comprises a contact layer formed from a metal semiconductor alloy directly adjoining the first semiconductor column and a fill structure comprising a metal or a conductive metal compound; and
forming an insulator structure laterally directly adjoining the contact structure.

19. The method of claim 18, further comprising:
forming a second semiconductor column directly adjoining the semiconductor fin at a side opposite to the first semiconductor column, the second semiconductor column comprising a drain region forming a second homojunction with the channel region.

20. The method of claim 19, wherein the drain region extends from the main surface plane to the semiconductor fin and comprises at least a drift zone forming the second homojunction and a drain contact zone, and wherein a maximum net dopant concentration in the drain contact zone is at least ten times as high as a mean net dopant concentration in the drift zone.

* * * * *